US007210087B2

(12) United States Patent (10) Patent No.: US 7,210,087 B2
Mukai et al. (45) Date of Patent: Apr. 24, 2007

(54) METHOD AND SYSTEM FOR SIMULATING A MODULAR TEST SYSTEM

(75) Inventors: Conrad Mukai, San Jose, CA (US);
Ankan Pramanick, San Jose, CA (US);
Mark Elston, Salinas, CA (US);
Toshiaki Adachi, San Jose, CA (US);
Leon L. Chen, San Jose, CA (US)

(73) Assignee: Advantest America R&D Center, Inc., Santa Clara, CA (US)

( * ) Notice: Subject to any disclaimer, the term of this patent is extended or adjusted under 35 U.S.C. 154(b) by 293 days.

(21) Appl. No.: 10/917,711

(22) Filed: Aug. 13, 2004

(65) Prior Publication Data

US 2005/0262412 A1 Nov. 24, 2005

Related U.S. Application Data

(60) Provisional application No. 60/573,577, filed on May 22, 2004.

(51) Int. Cl.
*G01R 31/3183* (2006.01)
*G01R 31/42* (2006.01)

(52) U.S. Cl. ..................................... 714/742; 714/741

(58) Field of Classification Search ................ 714/742, 714/741, 738, 25, 30, 45, 48, 715, 724, 718, 714/54, 719; 703/13, 22
See application file for complete search history.

(56) References Cited

U.S. PATENT DOCUMENTS

| 4,807,161 | A | 2/1989 | Comfort et al. |
| 5,488,573 | A | 1/1996 | Brown et al. |
| 5,892,949 | A | 4/1999 | Noble |
| 6,028,439 | A | 2/2000 | Arkin et al. |
| 6,195,774 | B1 | 2/2001 | Jacobson |
| 6,405,364 | B1 | 6/2002 | Bowman-Amuah |
| 6,427,223 | B1 | 7/2002 | Kim et al. |
| 6,601,018 | B1 | 7/2003 | Logan |
| 2002/0073375 | A1 | 6/2002 | Hollander |
| 2003/0005375 | A1 | 1/2003 | Krech, Jr. et al. |
| 2003/0217343 | A1 | 11/2003 | Rajsuman et al. |

(Continued)

FOREIGN PATENT DOCUMENTS

DE 10031536 A1 1/2001

(Continued)

OTHER PUBLICATIONS

Chang, E. et al. (1998). "A Scalable Architecture for VLSI Test," *IEEE, Proceedings International Test Conference 1998*, Washington, DC. Paper 20.2, pp. 500-506.

(Continued)

*Primary Examiner*—Albert Decady
*Assistant Examiner*—Dipakkumar Gandhi
(74) *Attorney, Agent, or Firm*—Morrison & Foerster LLP

(57) ABSTRACT

A method for simulating a modular test system is disclosed. The method includes providing a controller, where the controller controls at least one vendor module and its corresponding device under test (DUT) model, creating a simulation framework for establishing standard interfaces between the at least one vendor module and its corresponding DUT model, configuring the simulation framework, and simulating the modular test system using the simulation framework.

34 Claims, 8 Drawing Sheets

U.S. PATENT DOCUMENTS

| | | | |
|---|---|---|---|
| 2004/0210798 A1* | 10/2004 | Higashi | 714/27 |
| 2004/0225459 A1 | 11/2004 | Krishnaswamy et al. | |
| 2005/0022087 A1 | 1/2005 | Pramanick et al. | |
| 2005/0154551 A1 | 7/2005 | Pramanick et al. | |

FOREIGN PATENT DOCUMENTS

| | | | |
|---|---|---|---|
| JP | 03130839 A * | 6/1991 | |
| WO | WO-2004/072669 A1 | 8/2004 | |
| WO | WO-2004/072670 A1 | 8/2004 | |

OTHER PUBLICATIONS

Conti, D. R. (2002). "Mission Impossible? Open Architecture ATE," *IEEE, Proceedings International Test Conference 2002*, Washington, DC. Panel 5.1, p. 1207.

Evans, A.C. (1999). "Applications of Semiconductor Test Economics, and Multisite Testing to Lower Cost of Test," *IEEE, Proceedings International Test Conference 1999*, Washington, DC. Paper 5.2, pp. 113-123.

Mirizzi, D.J. et al. (1993). "Implementation of Parrellelsite Test on an 8-Bit Configurable Microcontroller," *IEEE, Proceedings International Test Conference 1993*, Washington, DC. Paper 8.3, pp. 226-235.

Perez, S.M. (2002). "The Consequences of an Open ATE Architecture," *IEEE, Proceedings International Test Conference 2002*, Washington, DC. Panel P5.4, p. 1210.

Schoettmer, U. et al. (1995). "Challenging the 'High Performance—High Cost' Paradigm in Test," *IEEE, Proceedings International Test Conference 1995*, Washington, DC. Paper 37.1, pp. 870-879.

Simpson, W.R. (1995). "Cutting the Cost of Test; the Value-added Way," *IEEE, Proceedings International Test Conference 1995*, Washington, DC. Paper 41.2, p. 921.

West, B.G. (2002). "Open ATE Architecture: Key Challenges," *IEEE, Proceedings International Test Conference 2002*, Washington, DC. Panel P5.6, p. 1212.

Fan, D. et al. (2003). "Case Study—Using STIL as Test Pattern Language," *NPTest, Inc*. LLC, ITC International Test Conference, 32:3, pp. 811-817.

Fan, D. et al. (2003). "Case Study—Using STIL as Test Pattern Language," *NPTest, Inc. LLC, ITC International Test Conference*, Paper 32:3, pp. 811-817.

Perez, S.M. et al. (Jul. 16, 2003). "Open Architecture Test System: The New Frontier," *28th IEEE/CPMI/SEMI International Electronics Manufacturing Technology Symposium*, San Jose, CA, Jul. 16-18, 2003, pp. 211-214.

International Search Report mailed on Sep. 16, 2005 for PCT Application No. PCT/JP2005/009809 filed on May 23, 2005, 4 pages.

Portelli, B. et al. (May 22, 1989). "Demonstration of Avionics Module Exchangeability via Simulation (DAMES) Program Overview," *Proceedings of the IEEE 1989 Natl Aerospace and Elect. Conf.* (NAECON 1989), Dayton, OH, vol. 2:660-667.

Rajsuman, R. (Jan. 30, 2004). "An Overview of the Open Architecture Test System," *Proceedings of the 2nd IEEE Intl Workshop on Elect. Design, Test, and Applications (Delta '04)*, pp. 1-6.

Semiconductor Test Consortium. "ATE Open Architecture Initiative," (Oct. 8, 2002). located at <http://www.semitest.org/site/News/News_Files/file_news2> last visited on Mar. 8, 2006, 12 pages.

* cited by examiner

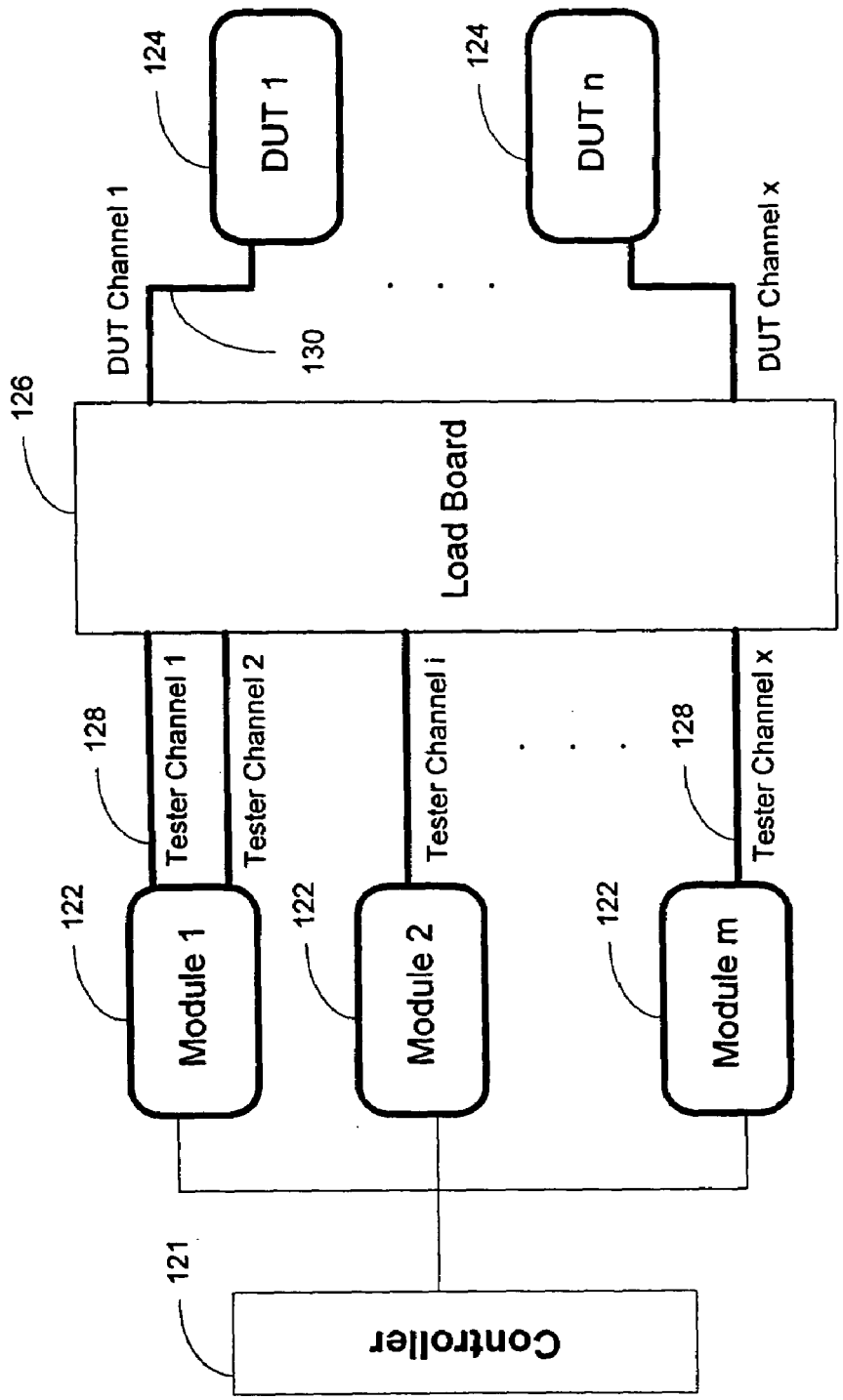
Figure 1b. Simulation System Overview

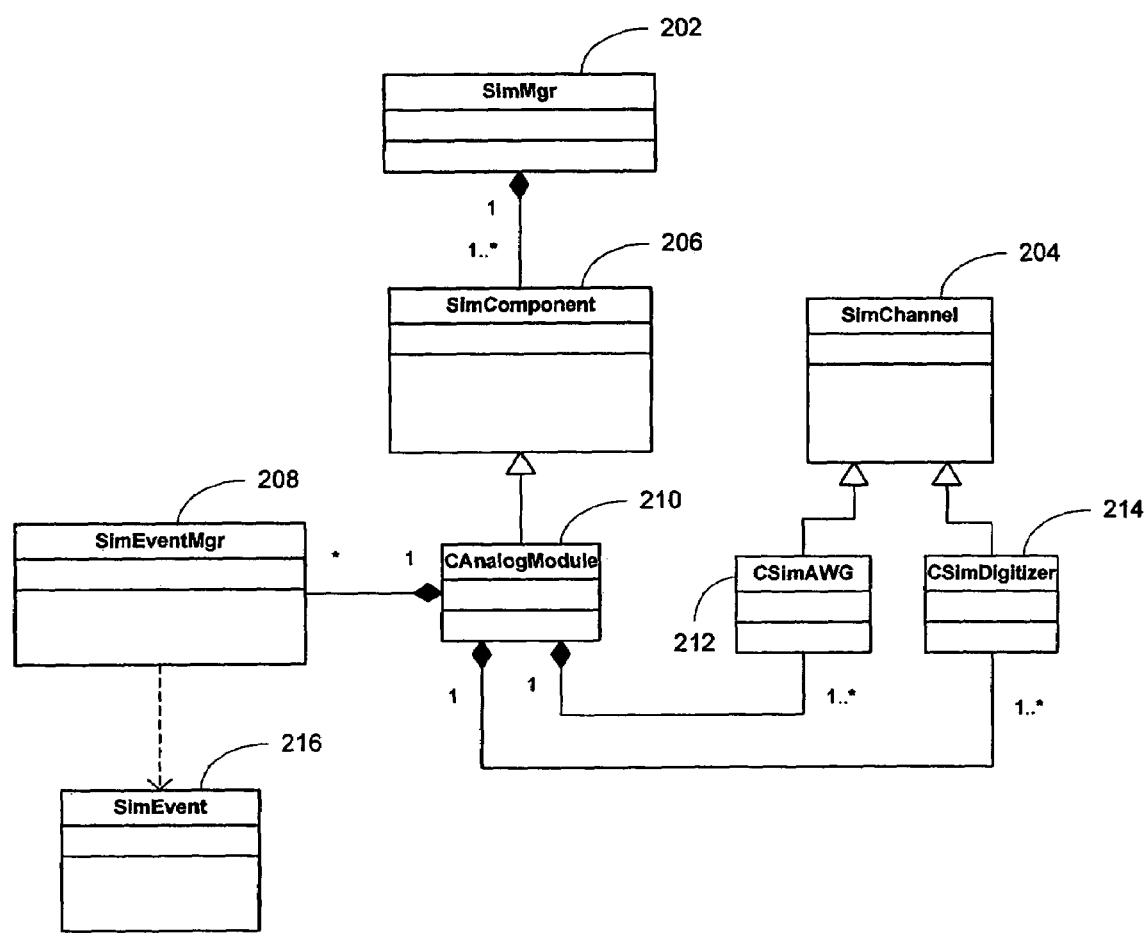
Figure 2. Simulation Framework Class Structure

METHOD AND SYSTEM FOR SIMULATING A MODULAR TEST SYSTEM

CROSS-REFERENCE TO RELATED APPLICATIONS

This application claims the benefit of provisional application No. 60/573,577, "Software Development in an Open Architecture Test System," filed by Advantest Corporation on May 22, 2004, which is incorporated herein in its entirety by reference.

FIELD OF THE INVENTION

The present invention relates to the field of automated test equipment (ATE). In particular, the present invention relates to a method and system for simulating a modular test system.

BACKGROUND OF THE INVENTION

A major cost in semiconductor production is the development and maintenance of test programs that test integrated circuits for viability and functionality. This activity usually entails many hours of work on the actual tester hardware. However, existing semiconductor testers have little or no capability for simulating test programs, except for checking the semantics of the test programming language. This limitation forces engineers to debug their test programs on the actual tester hardware. But using tester hardware for test program development is not a cost-effective use of the expensive test equipment. Besides, since a tester is usually shared among groups of engineers, the amount of time allocated to use the tester is limited, which creates a bottleneck in the development of test programs, resulting in a process where development occurs serially. Such limitations in test program development may delay production of the integrated circuits, which could delay product release and lost market opportunities.

Therefore, there is a need for a method and system for verifying test program functionality without using expensive test equipment. In particular, there is a need for a method and system for simulating a modular test system with test programs, vendor modules, and their corresponding device-under-tests (DUTs).

An objective of the present invention is to reduce the amount of use of tester hardware for test program development, thereby optimizing the use of the valuable tester equipment. Another objective of the present invention is to identify problems in the test programs, modules and DUTs before they are run on the tester equipment. Yet another objective of the present invention is to provide an environment for parallel development of test programs, modules, and DUTs, thereby reducing the overall product development time.

SUMMARY

The disclosed method for simulating a modular test system provides a simulation framework that can be configured by an end-user. The framework is used to construct a simulation environment to load vendor emulation modules and DUT models, and to execute test programs through the simulation framework API. This method enables new vendor modules to be added to an existing installation, by installing the vendor's software emulation and editing a system configuration file. This method also enables engineers to develop test programs on their own workstations with minimized usage of the expensive tester equipment.

In one embodiment, a method for simulating a modular test system includes providing a controller, where the controller controls at least one vendor module and its corresponding DUT model, creating a simulation framework for establishing standard interfaces between the at least one vendor module and its corresponding DUT model, configuring the simulation framework, and simulating the modular test system using the simulation framework.

In another embodiment, a modular test system includes one or more vendor modules, one or more DUT models, a controller for controlling the vendor modules and their corresponding DUT models, and a simulation framework for establishing standard interfaces between the vendor modules and the DUT models. The modular test system further includes means for configuring the simulation framework, and means for simulating the modular test system using the simulation framework.

BRIEF DESCRIPTION OF THE DRAWINGS

The aforementioned features and advantages of the invention as well as additional features and advantages thereof will be more clearly understood hereinafter as a result of detailed descriptions of embodiments of the invention when taken in conjunction with the following drawings.

FIG. 1b illustrates an overview of the simulation system of an embodiment of the present invention.

FIG. 2 illustrates a simulation framework for simulating the modular test system.

DESCRIPTION OF EMBODIMENTS

Methods and systems are provided for simulating a modular test system. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1A:
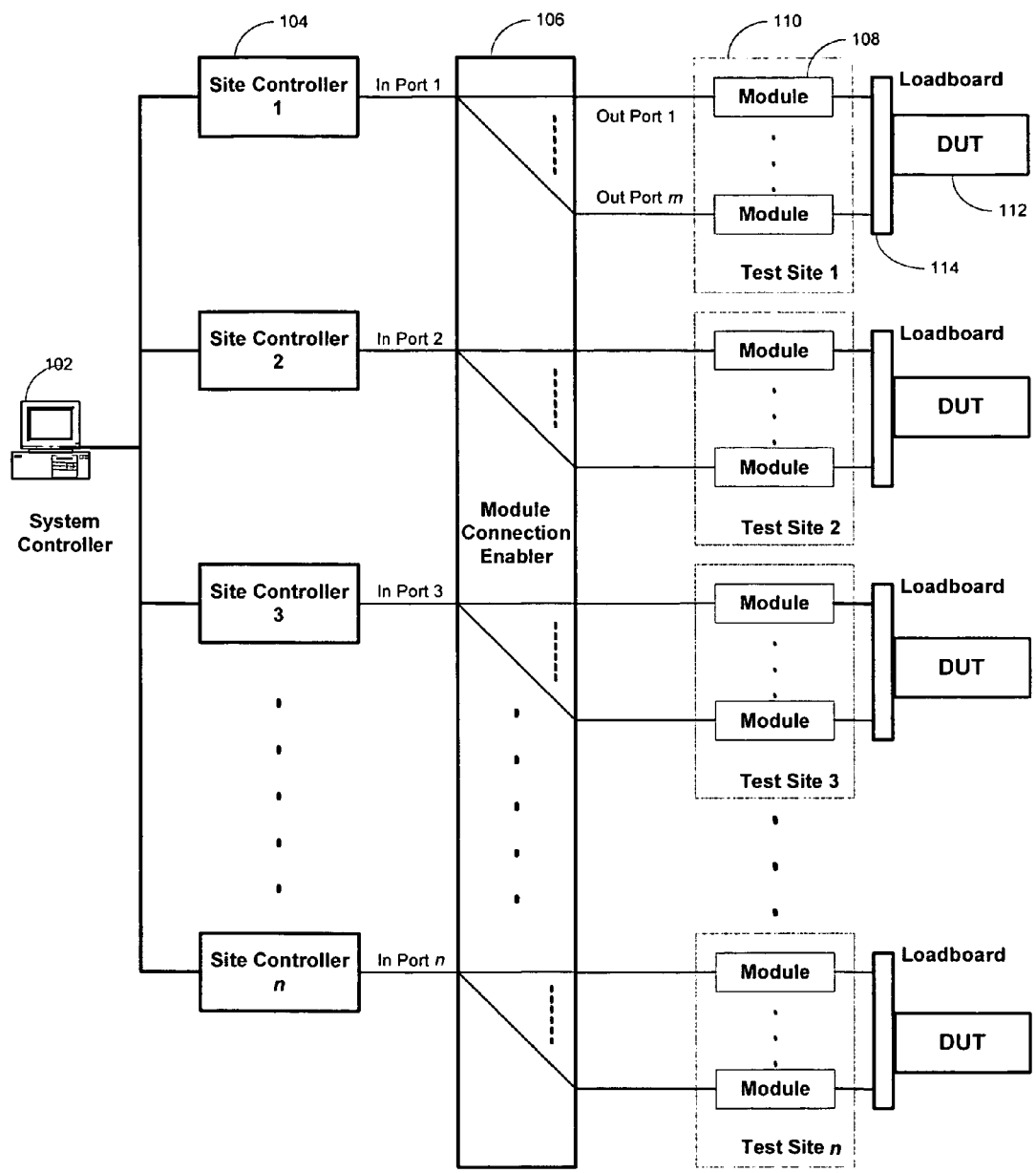
FIG. 1a illustrates an open architecture test system according to an embodiment of the present invention.

FIG. 1a illustrates an open architecture test system according to an embodiment of the present invention. A system controller (SysC) 102 is coupled to multiple site controllers (SiteCs) 104. The system controller may also be coupled to a network to access associated files. Through a module connection enabler 106, each site controller is coupled to control one or more test modules 108 located at a test site 110. The module connection enabler 106 allows reconfiguration of connected hardware modules 108 and also serves as a bus for data transfer (for loading pattern data, gathering response data, providing control, etc.). In addition, through the module connection enabler, a module at one site can access a module at another site. The module connection enabler 106 allows different test sites to have the same or different module configurations. In other words, each test site may employ different numbers and types of modules. Possible hardware implementations include dedicated connections, switch connections, bus connections, ring connections, and star connections. The module connection enabler 106 may be implemented by a switch matrix. For example, each test site 110 is associated with a DUT 112, which is connected to the modules of the corresponding site through a loadboard 114. In another embodiment, a single site controller may be connected to multiple DUT sites.

The system controller 102 serves as the overall system manager. It coordinates the site controller activities, manages system-level parallel test strategies, and additionally provides for handler/probe controls as well as system-level datalogging, and error-handling support. The system controller 102 is the primary point of interaction for a test engineer in verifying and debugging the test environment. It provides a gateway to the site controllers 104, and manages the synchronization of the site controller activities in a multi-DUT environment. It further runs user applications and tools, such as the test simulation module. Depending on the operational setting, the system controller 102 can be deployed on a CPU that is separate from the operation of site controllers 104. Alternatively, a common CPU may be shared by the system controller 102 and the site controllers 104. Similarly, each site controller 104 can be deployed on its own dedicated CPU (central processing unit), or as a separate process or thread within the same CPU.

The site controllers 104 are responsible for running a test plan to test the DUTs. The test plan creates specific tests by using the Framework Classes as well as standard or user supplied Test Classes that encapsulate the test methodology. In addition, the test plan configures the hardware using the Standard Interfaces, and defines the test flow.

The system architecture of the present invention may be conceptually envisioned as the distributed system shown in FIG. 1 with the understanding that the individual system components may also be regarded as logical components of an integrated, monolithic system, and not necessarily as physical components of a distributed system. The plug-and-play or replaceable modules are facilitated by use of standard interfaces at both hardware and software levels. A tester operating system (TOS) allows a user to write test plan programs using a test plan programming language, and to operate the test system in a way specific to a particular device under test (DUT). It also allows the user to package sequences of the test system operations commonly used in test plan programs as libraries. These libraries are sometimes referred to as test classes and test templates.

FIG. 1*b* illustrates an overview of the simulation system of an embodiment of the present invention. The simulation system includes a controller model 121, one or more vendor emulation modules 122 (note that the term vendor emulation module is also referred to as vendor module or emulation module), one or more device under tests (DUT) models 124, and a loadboard model 126. To assemble the simulation environment, the user creates a system configuration file and an offline configuration file (both are described in detail below) that describe how the emulation modules, loadboard model, and DUT models are connected through the simulation framework. The simulation execution is performed on the pattern loaded into the module models by the test program.

The simulation framework supplies the loadboard model 106, one or more tester channels 128, and one or more DUT channels 130. The modules are loaded from vendor's dynamic link libraries (DLLs). Each block represents a single instance of a module. A DLL can be loaded multiple times to create multiple instances of the same module type. The DUT models 124 can be either supplied as DLLs if the model is written in C++, or as Verilog modes.

The loadboard model 126 is configurable by the user. The user maps the tester channels 128 to the corresponding DUT channels 130, and specifies a transport delay associated with each connection. All the connections are bidirectional, hence, no special consideration is required to designate connectors as output drivers or input strobes.

Simulation Framework

A main part of the test system simulation is the simulation framework, which is also referred to as the framework. The framework provides two fundamental services. First, it allows each vendor module to be programmed in substantially the same way as during normal tester operations through the system bus. By simulating bus calls, a test program can write into emulated module registers, thereby setting up tests. The other service is the simulation of test execution. The framework provides a model for the physical connections between the emulated modules and the DUT model. The framework also supplies an engine for maintaining the execution sequence of the various simulation components.

When the test system is in the simulation mode (offline mode), it replaces the device driver used to communicate with the tester module hardware, with a software module that communicates with the framework through shared memory. In the actual tester, the communication to the modules is facilitated by a hardware module known as a bus. A bus typically uses commands that send a binary pattern to an addressable register in a vendor's hardware module. In the simulation, the same command is received and interpreted by the framework to target a specific emulated module. The framework then sends the register address and data to the module so that it may save the data in its simulated register. Since test program loading is ultimately decomposed into these fundamental units of address/data pairs, this simple model supports all interaction the test program has with the modules. A by-product of this process is a simulation that also supports calibration and diagnostic program development.

Because the only difference in the runtime software between online and offline modes is in the system bus device driver, there is a high degree of correlation between the behavior of a test program in the online environment and its corresponding behavior in the offline environment. Thus, the simulation is accurate with regard to behavior of the user's test program and the underlying tester operating system (TOS).

The framework also provides a detailed model of the physical connections between the tester modules and the DUT. All connections are modeled as voltages on a wire, thus reproducing the underlying physics. Since there are no assumptions regarding data formats in the module/DUT interactions, the framework works with any combination of emulation modules and DUT models, so long as they use the application programming interface (API) established by the framework. The framework provides an automatic reconciliation of voltages when two supplies drive on the same wire simultaneously.

To control the simulation during the execution of a test program, the framework provides various methods in its API that allow a vendor's modules to register for and receive events. The framework uses these events to control the sequence of execution of the emulated modules and DUT models. By managing these events and by specifying some fundamental rules regarding how a module handles events, a flexible template for creating module emulations is made available to the users of the modular test system.

FIG. 2 illustrates a simulation framework for simulating the modular test system. The simulation framework includes a simulation manager (SimMgr) class 202, a simulation channel (SimChannel) class 204, a simulation component (SimComponent) class 206, and a simulation event manager (SimEventMgr) class 208. The SimMgr class 202 manages the simulation process. The SimComponent 206 is a base class for vendors to use. Certain required behaviors are implemented within this class. Many of the methods are virtual (in C++) and require vendor implementation. The CAnalogModule class 210, inherits from the SimComponent class 206, is used for adding the required vendor-specific functionality.

The CAnalogModule class 210 includes a set of SimChannel-derived objects, namely a CSimAWG object 212 and a CsimDigitizer object 214. These objects represent the system resources (IResource-derived classes in the control structure), where the CSimAWG object is an analog waveform generator that models a D/A channel (analog output from a digital command), and the CSimDigitizer object models a corresponding A/D channel (digital input from an analog signal). The IResource-derived class requirements are incorporated into these implementation classes, and these classes use system-provided utilities for generating and reading waveforms. The SimEventMgr class 208 further includes a simulation event object 216. A detailed description of each component of the simulation framework is described below.

The simulation framework enforces a set of predefined interfaces and design constraints on the emulation module and DUT model developers. This guarantees that models that meet the requirements of the simulation framework are compatible with other components in the simulation. The simulation framework is divided into three parts, a first part for the API common to both emulation modules and DUT models, a second part specific to the module models, and a third part specific to the DUT models. In one implementation, vendor emulation modules are considered to be event-based models, while DUT models are considered to be time-based models. In other embodiments, both emulation modules and the DUT models may be either event-based or time-based models.

Simulation Channel

Figure 3A:
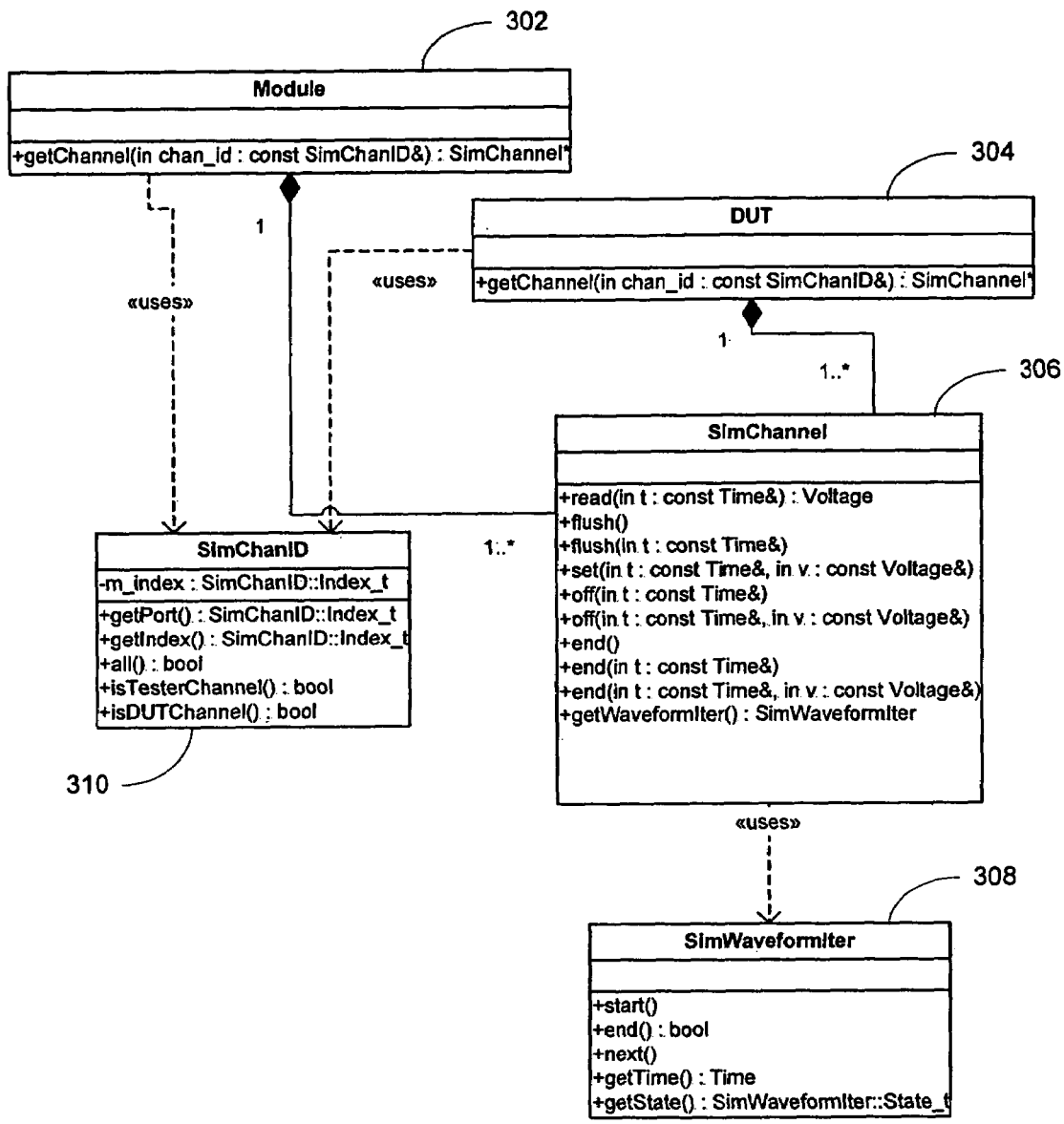
FIG. 3a illustrates a simulation framework for handling simulation channel objects according to an embodiment of the present invention.

FIG. 3a illustrates a simulation framework for handling simulation channel objects according to an embodiment of the present invention. The simulation framework includes a module class 302, a DUT class 304, and a simulation channel (SimChannel) class 306. The SimChannel class 306 includes a simulation waveform iterator (SimWaveformIter) class 308, and the module class 302 includes a simulation channel identifier (SimChanID) class 310.

The SimChannel class 306 provides I/O capabilities to the emulation modules and the DUT models through the module class 302 and the DUT class 304 respectively during pattern execution. To use this class, an empty channel object is constructed for each module channel or DUT pin. Based upon the settings in the simulation configuration file (described below), these channels are connected with the corresponding channel on the loadboard by the simulation framework. The simulation framework obtains a reference to the SimChannel object through the getChannel( ) method, which is used to make the loadboard connection.

The elements common to both the module and DUT models are the I/O calls to the channels. All I/O calls between modules and DUTs are done by setting voltage levels at specific times. This is provided by the set( ) method from the SimChannel class 306. This method allows the calling routine to specify a voltage at a specific time by writing an entry into the output buffer connected to the SimChannel class 306.

Figure 3B:
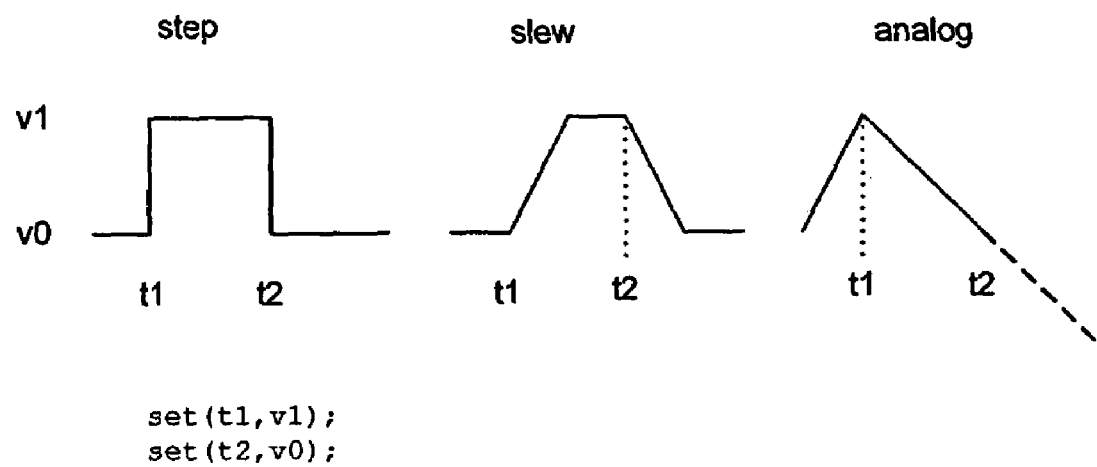
FIG. 3b illustrates the step, slew, and analog waveforms according to an embodiment of the present invention.

In one embodiment, the set( ) method writes a point into the voltage time history. The form of the waveform depends upon the how the channel is configured. FIG. 3b illustrates the step, slew, and analog waveforms according to an embodiment of the present invention. In a step channel, the voltage transition is instantaneous, so that any reading between t1 and t2 returns a voltage of v1. In a slew channel, the voltage transition from its current state to the commanded state takes a finite amount of time. The slope of the transition is determined by the slewRate parameter in the slew section of the system configuration file. Finally, in an analog channel, the voltage does not level off. Voltages between time points are computed through a piece-wise linear interpolation. If a reading is taken beyond the last point, then the value is extrapolated from the last two points; hence, if no points are added beyond the set call for t2, the dashed line represents what voltage would be read from the channel.

The off( ) method is primarily used to turn off the drive on the voltage. This happens when two components are writing to the opposite side of a channel simultaneously. If one side calls the set( ) method, then that voltage is considered to be driven. If the other side calls the off( ) method, then that voltage is considered to be passive. In this case, the driving voltage prevails and after the voltages on both sides are resolved, the voltage read from either channel is the voltage input with the set( ) command. If both sides call the set( ) method or both sides call the off( ) method, then the voltage history is set to a mean voltage value.

The end( ) method call indicates to the simulation framework that the channel is ready for resolution, and subsequently for reading by a component on the other side of the channel. If the end( ) method is not called on a channel, then the signals on that channel may not propagate through the rest of the simulation since the components on the opposite side of the channel are not signaled to read from the channel. Typically the user makes several set calls to specify the voltage over a time range, and then calls the end( ) method once at the end of the time range.

The SimWaveformIter class 308 identifies transitions in waveforms. The user gets an instance of a waveform iterator by calling the getWaveformIter( ) method in the SimChannel class 308. This method requires the user to specify high and low voltages as well as starting and stopping times. Using this data, the getWaveformIter( ) method returns an instance of the SimWaveformIter class 308. The getWaveformIter( ) method further allows the user to step through all the edge transitions in a waveform. For each transition, it returns the time of the transition and the state of the waveform following the transition. The state is specified as an enumerated type State_t. The possible values for this type are H (high), L (low), and Z (tristate).

In one implementation of the present invention, an example of the getWaveformIter( ) method is shown below.

```
void findHighs(SimChannel& sc, const Voltage& vhi, const Voltage& vlo,
        const Time& t_start, const Time& t_end)
{
  SimWaveformIter iter = sc.getWaveformIter( );
  for (; !iter.end( ); iter.next( ))
  {
            if (iter.getState( ) == SimWaveformIter::H)
        {
      cout << "waveform goes high at " << iter.getTime( ).getValue( )
          << endl;
    }
  }
}
```

The SimWaveformIter class 308 includes the following methods.

start ( ): Set the iterator to the first transition.

end ( ): The end( ) method checks if the iterator is at the end of the edge sequence. Note that if this method returns true, the results of getTime and getState are undefined.

next ( ): The next( ) method moves iterator to the next transition.

getTime ( ): The getTime( ) method returns time for the current transition.

getState ( ): The getState( ) method obtains the state of the current edge. The edge applies to the state of the underlying waveform after the edge time.

In another embodiment, the SimChannel class 306 provides the capability to read the voltage on a channel at a specified time. This is done through the read( ) method using a single time argument. The value returned by the read( ) is interpolated from data stored in a table containing times versus voltage information. The method of interpolation is based on the channel configuration as defined in the simulation configuration file. If the channel is configured as a step channel, then a square wave model is used. If the channel is configured as a slew channel, then a slew model is used to interpolate voltage transitions occuring over a finite time. If the channel is an analog channel, then the voltage is computed using a piecewise linear interpolation.

In addition, the user is responsible for managing the data in a channel. This is done through the flush( ) method. This method registers the channel for a clean-up phase. It indicates that no reads prior to the time specified by the flush argument may occur. When the flush( ) method is called, all records before the specified time are removed from the channel during the next clean-up cycle. The flush( ) method is called on a regular basis for long patterns where memory limitations may prevent the completion of the simulation.

In yet another embodiment, to write to a channel, the primary method for specifying an output voltage is the set( ) method, where the user specifies a time and an associated voltage as parameters. This method provides an input to the channel's time history. If a drive is turned off, the off( ) method may be used. This indicates that if a signal is being driven from the other side of the interface, it dictates the voltage on the channel. The off( ) method is used primarily for bidirectional channels that perform both drive and strobe operations.

The user may indicate that the set of values that have been input into the channel are ready for transmission to the other side of the interface. This is done through the overloaded end( ) method. The end( ) method indicates to the simulation framework that the values on the channel are ready for reading, up to and including the time specified in the end( ) call. Note that an end( ) method without argument defaults to the maximum time in either the set( ) or off( ) call. The end( ) method is called for the set( ) method to take effect. If the end( ) method is not called, no data is transferred to the other end of the channel.

In one embodiment, the common API classes are used as follows.

```
// create some channels in constructor
SimChannel MyStepChannel;
SimChannel MySlewChannel;
SimChannel MyAnalogChannel;
...
// channel registration
SimChannel* getChannel(const SimChanID& chan)
{
  if (chan.getIndex( ) == MY_STEP_CHANNEL_INDEX)
  {
    return &MyStepChannel;
  }
  else if (chan.getIndex( ) == MY_SLEW_CHANNEL_INDEX)
  {
    return &MySlewChannel;
  }
  else if (chan.getIndex( ) == MY_ANALOG_CHANNEL_INDEX)
  {
    return &MyAnalogChannel;
  }
  ...
}
// running a pattern
void handleEvent(const SimEvent& event, const Time& t)
{
  if (event.isWriteEvent( ))
  {
    ...
    // set some output voltages on the step channel
    MyStepChannel.set(t0, hi_level);
    MyStepChannel.set(t2, lo_level);
    MyStepChannel.end(t4);
    // set some output voltages on the slew channel
    MySlewChannel.set(t0, hi_level);
    MySlewChannel.set(t2, lo_level);
    MySlewChannel.end(t4);
    // set some output voltages on the analog channel
    MyAnalogChannel.set(t0, lo_level);
    MyAnalogChannel.set(t1, hi_level);
    MyAnalogChannel.set(t2, hi_level);
    MyAnalogChannel.set(t3, lo_level);
    MyAnalogChannel.set(t4, lo_level);
    ...
  }
  else if (event.isReadEvent( ))
  {
    ...
    // now strobe the step channel
    Voltage strobe_value = MyStepChannel.read(t5);
    MyStepChannel.flush(t5); // done reading
    ...
  }
  ...
}
```

Note that for analog signals, all corners of the waveform need to be specified, whereas in the step and the slew waveforms, only the transitions need to be specified.

The getWaveformIter( ) method allows the caller to return the state that is available from a window strobe. It takes a high input voltage, a low input voltage, and a time window as arguments and returns an object that contains the times at which the voltages are crossed.

The SimChanID class 310 encapsulates channel indices. There are two sets of channel indices in the test system, one for the tester channel space, and the other for the DUT channel space. The SimChanID class encapsulates a 20 bit word that describes an index in either space. The most significant bit indicates whether the channel index is for the tester channel space or for the DUT channel space. The next bit is a flag indicating whether all channels are being used. The next 7 bits are the port or DUT index for either the tester module or DUT respectively. The least significant 12 bits are used for the local index values (4K channels).

The SimChanID class 310 includes the following methods.

SimChanID( ): The SimChanID( ) method returns true if all the channel bits are set.

getIndex( ): The getindex( ) method returns the index in the local channel space. The isTestChannel and isDUTChannel methods indicate whether the index is for the tester or DUT space respectively. If the all( ) method returns true, then the result of this method is undefined.

getPort( ): The getPort( ) method returns the port for the given channel ID. The combination of port and index uniquely identifies all channels on one side of the loadboard.

isDUTChannel( ): The isDUTChannel( ) method returns true if channel is in the DUT channel space.

isTesterChannel( ): The isTesterChannel( ) method returns true if channel is in the tester channel space.

Simulation Components

Figure 4:
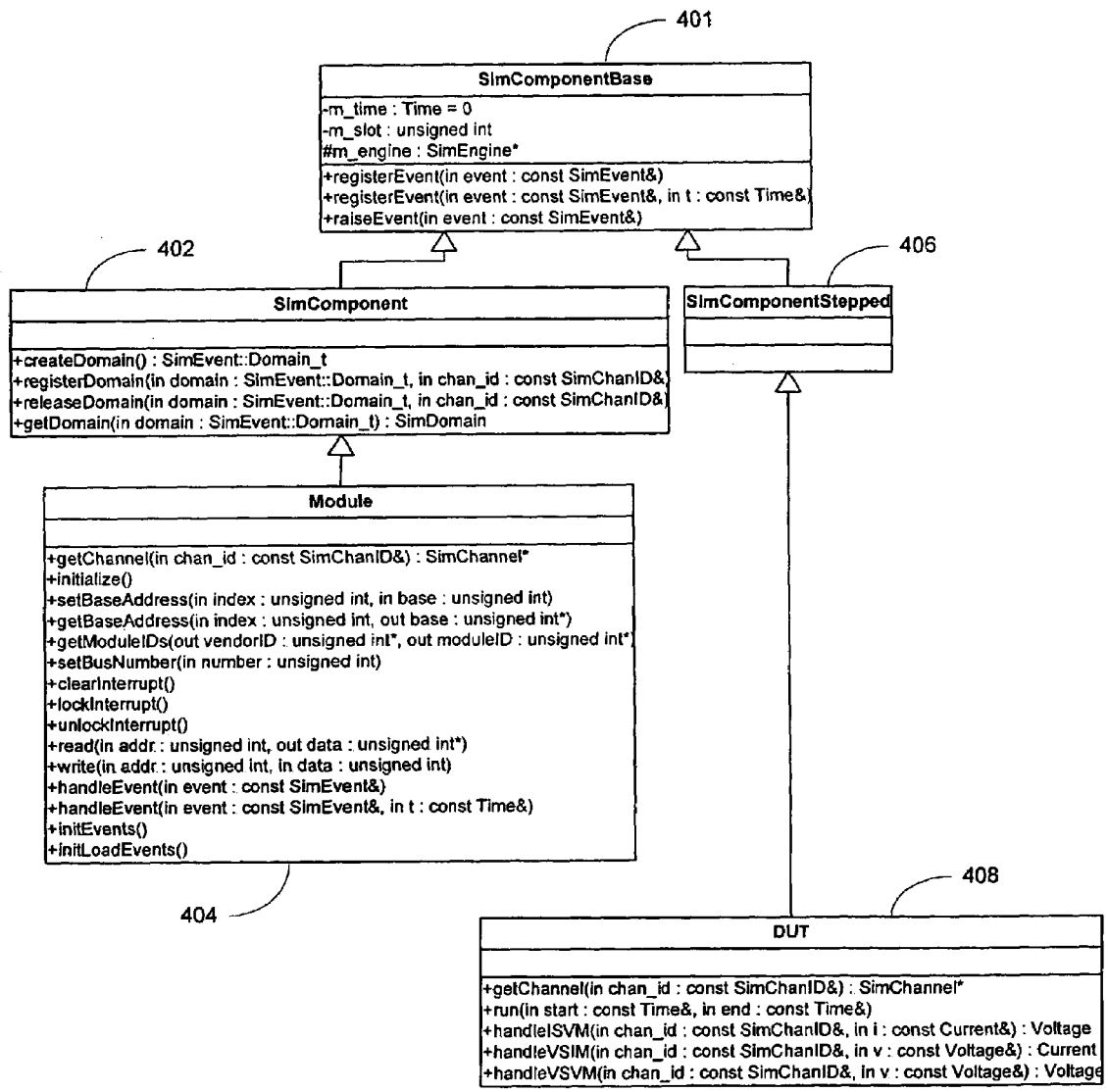
FIG. 4 illustrates a simulation framework for handling simulation components according to an embodiment of the present invention.

FIG. 4 illustrates a simulation framework for handling simulation components according to an embodiment of the present invention. The simulation framework includes a simulation component base (SimComponentBase) class 401. The SimComponent class 402 and the SimComponentStepped class 406 are derived from the SimComponentBase class. The vend( )r emulation module (Module) class 404 is derived from the SimComponent class. Virtual functions are developed within the SimComponent class 402 to define the module's behavior. Similarly, the DUT class 408 is derived from the SimComponentStepped class 406. The SimComponentBase 401 is the common base class that includes the methods shared by both the SimComponent 402 and SimComponentStepped 406 classes.

The Module class 404 calls the handleEvent( ) method for handling simulation event objects. The handleEvent( ) method is used in conjunction with some services provided by registerEvent( ), and raiseEvent( ) of the SimComponent class. The registerEvent( ) method allows a module to register an event with the simulation framework. Events can be associated with a single channel, a group of channels, or an entire module. Events can also be registered with a specific time, in which case the caller identifies the event as either a read or write event. If an event is a write event then the handleEvent( ) callback for the module is invoked as soon as the simulation reaches the registration time. If the event is a read event, then the handleEvent( ) callback is invoked only after all of the channels for which the event is associated are resolved and ready for reading.

When the handleEvent( ) call is made in response to an event with an associated time (i.e., synchronous event), then the module needs to obey the rules set forth by the API as defined in the simulation framework in order for the simulation to work properly:

For write events, the module can only set voltage values for times after the time of the write event.

For read events, the module can only read voltage values for times before the time of the read event.

Events can also be registered without times (i.e., asynchronous events). These events are initiated by other modules, or by the simulation framework. These events support two functions. The first function is for handling certain well known events in the system, such as interrupts. The second function is for handling inter-module communications. Asynchronous events allow one module to notify another module that a certain set of conditions have occurred. An example is a synchronous module notifying digital pin modules at the start of a cycle, so that the digital pin modules output the edges associated with the current cycle.

For a vendor's module to be loaded into the framework, the vendor preferably exports some predefined functions from its DLL that supports the creation and destruction of objects that maintain the emulation module model. This standardized interface hides the details of loading each model.

Simulation models are derived from the SimComponent class, which are made accessible to the simulation framework. To define the models, a user implements the virtual functions specified in the SimComponent class. The virtual functions of a module fall into two categories:

virtual methods that the derived class needs to provide; and basic functions that have default implementations that the user can redefine.

Besides these functions, this class also provides services to the derived classes for event management.

DUT models are implemented by deriving from the SimComponentStepped Class 406 of the simulation framework. The developer implements the virtual functions in the SimComponentStepped class 406 to define the module's behavior. For example, the run( ) method invokes the DUT model to run over a specified time window. Because of the simplicity of the interface, a model designer is given great latitude in how the DUT can be modeled. This latitude is supported by the common interface for C/C++ models or DLLs that connect to a server running Verilog models. The details of how the DUT models are implemented are isolated from the rest of the simulation, allowing such models to be used interchangeably. To provide a DUT model in the simulation framework, the SimComponentStepped class includes the following virtual methods:

run( ): The user runs the DUT model through a specified time window. Successive run( ) calls may begin where the last run( ) call has ended.

handleISVMO: This method returns the measurement from a parametric measurement unit (PMU) for the specified channel. Note that a PMU is used to make static DC measurements on a channel while the test is in a paused state, or between tests.

handleVSIM( ): This method returns the PMU measurement for the specified channel.

handleVSVM( ): This method returns the PMU measurement for the specified channel.

To load a DUT model into the simulation framework, the DLL exports a set of predefined functions that support the creation and destruction of objects that maintain the DUT model. This standardized interface hides the details of loading each model.

Simulation Event Manager

Figure 5:
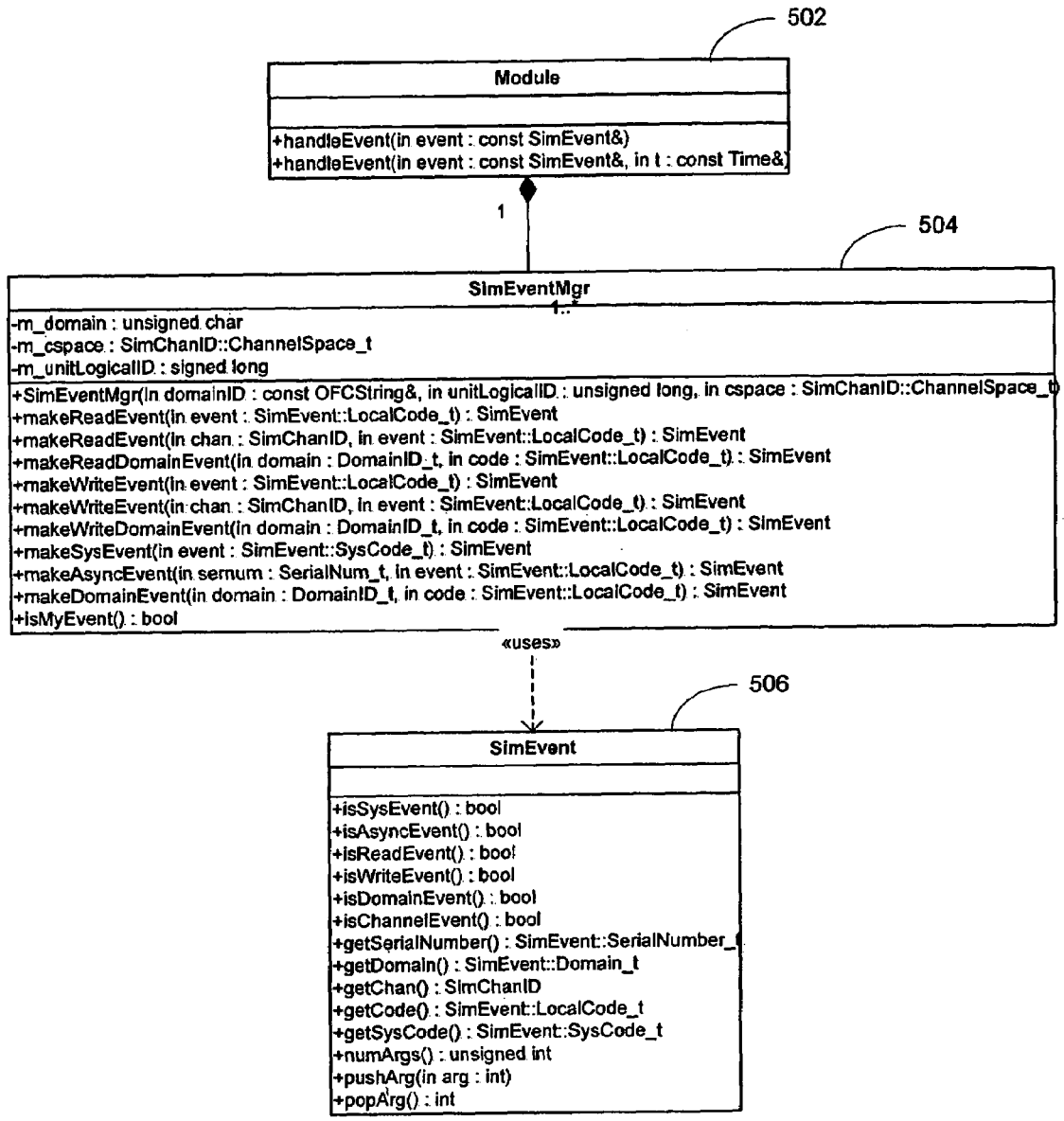
FIG. 5 illustrates a simulation framework for handling simulation event objects according to an embodiment of the present invention.

FIG. 5 illustrates a simulation framework for handling simulation event objects according to an embodiment of the present invention. The simulation framework includes a module class 502, a simulation event manager (SimEventMgr) class 504, and a simulation event (SimEvent) class 506.

The SimEventMgr class 504 generates instances of the SimEvent class 506. The SimEventMgr class 504 is used to maintain a vendor index. This index uniquely identifies a family of events. Normally the family of events is associated with a vendor, which has an assigned vendor ID string. The class also allows the user to create another family of events so that two or more groups of modules can share events in a separate event space.

In one embodiment, to create a SimEventMgr object for a specific vendor index the following constructor is used:
SimEventMgr(constOFCString&, SimChanID::ChannelSpace_t)

The string argument specifies the event family. The channel space type indicates whether the channels for the events are tester channels (SimChanID::TESTER_SPACE) or DUT channels (SimChanID::DUT_SPACE). For example, if the user wishes to create events for "ADVANTEST" tester modules the following method is called:
SimEventMgr emgr(_T("ADVANTEST"), SimChanID::TESTER_SPACE);

A module developer creates an instance of the SimEventMgr for each domain that the module belongs to. These objects are used for the duration of a module's existence. For example, the following set of calls are made to produce events for various domains:
SimEventMgr m_advmgr(_T("ADVANTEST"), SimChanID::TESTER_SPACE);
SimEventMgr m_msomgr(_T("MSO_CONSORTIUM"), SimChanID::TESTER_SPACE);
SimEventMgr m_pwrmgr(_T("POWER_GROUP"), SimChanID::TESTER_SPACE);

During the course of a simulation, each of these objects may produce events for each of the domains. In this way, modules created by different vendors can share events by agreeing upon a unique name for their shared domain. In the event that DUT models need to register for events, the clientmgr( ) method is used. Note that a distinction is made between the DUT space and tester space since the two channels belong to different index spaces.
SimEventMgr clientmgr("CLIENT", SimChanID::DUT_SPACE);

Various methods are used to create events. The methods for creating synchronous events include:
SimEvent makeReadEvent(SimEvent::LocalCode_t): This method creates a read event for all channels in the module.
SimEvent makeReadEvent(SimChanID::Index_t, SimEvent::LocalCode_t): This method creates a read event for a single channel.
SimEvent makeReadDomainEvent(SimEvent::Domain_t, SimEvent::LocalCode_t): This method creates an asynchronous event for a particular domain.
SimEvent makeWriteEvent(SimEvent::LocalCode_t): This method creates a write event for all channels in the module.
SimEvent makeWriteEvent(SimChanID::Index_t, SimEvent::LocalCode_t): This method creates a write event for a single channel.
SimEvent makeWriteDomainEvent(SimEvent::Domain_t, SimEvent::LocalCode_t):
This method creates a write event for a single channel.

The functions that do not take the channel index as a parameter create events for all channels. The functions that take the user-specified channel index and the local code as a parameter produce SimEvents for specific channels. The functions that take the domain as an argument are used for a group of channels that have been tied to a specific domain.

The methods for creating asynchronous events include:
makeAsyncEvent( ): This method is used to create an asynchronous serial-number based event.
makeDomainEvent( ): This method is used to create an asynchronous domain-based event for a particular channel.
makeSysEvent( ): This method is used to create a system event.
isMyEvent( ): This method checks the domain of an event. It returns true when the given event belongs in the same domain as the event manager.

In one embodiment, if the module developer that produces the three event managers in the constructor example above needs to determine to which domain an event belongs, the following approach may be used.

```
if (m_advmgr.isMyEvent(event))
{
    // an ADVANTEST event
}
else if (m_msomgr.isMyEvent(event))
{
    // an MSO event
}
else if (m_pwrmgr.isMyEvent(event))
{
    // a power event
}
```

The SimEvent class 506 includes the following methods.
isChannelEvent( ): This method checks whether the event is for a single channel. The method returns true if the event is a channel-based event.
isDomainEvent( ): This method checks whether the event is for a domain. The method returns true if the event is a domain-based event.
isReadEvent( ): This method checks whether the object is a read event. The method returns true if the event is a read event.
isSerialNumberEvent( ): This method checks whether the event is for a specific serial number. The method returns true if the event is for a specific serial number.
isSysEvent( ): This method checks whether the object is a system event. The method returns true if the event is a system event.
isWriteEvent( ): This method checks whether the object is a write event. The method returns true if the event is a write event.
getchan( ): This method gets the SimChanID object.
getcode( ): This method gets the local user code.
getDomain( ): This method gets the domain, which returns the domain index of the event.
getSerialNumber( ): This method gets the serial number.
getSysCode( ): This method gets the system event code.
numargs( ): The method returns the number of user arguments.
popArg( ): This method accesses the next user argument in the queue. Note that arguments are retrieved in the same order they are added. Once an argument has been retrieved, it is no longer available from the event. Calling popArg more times than numArgs( ) results in an exception being thrown.
pushArg( ): This method adds a user argument.

Configuration Files

The simulation framework uses two configuration files, a simulation configuration file, and an offline configuration file. The simulation configuration file specifies what tester modules are available during the simulation. The offline configuration file specifies what DUT models are loaded and how they are connected to the tester.

The simulation configuration file is loaded when the function SimTester is initially launched. The settings in this file remain in effect for the life of the SimTester process. The offline configuration file is loaded as part of the user's test plan. The name of the file is specified with a test program language (TPL) command OfflineDef. This command can appear anywhere in the user's test program, but is traditionally placed in the testplan.tpl file with the other high-level commands.

In one embodiment, a sample simulation configuration file is given below. As shown below, the file is divided into hierarchical blocks. The Global block contains system-wide parameters. The EMUModule block names the DLL containing the emulator model and specifies the ports where a model is loaded. The EMUModule block contains the module interface for the simulation framework.

```
# T2000 System Software version of the configuration
Version 0.0.1;
Global
{
    InitVoltage 0.5 V;              # Required. Initial voltage on all
                                    # wires.
    RecoveryRate 2.5 V/nS;          # Optional. For drive conflict in
                                    # analog signals.
}
# Module Emulator.
EMUModule "module1" # Module DLL.
{
    Waveform                        # Optional. Resource declaration.
    {
        Step 1–32, 35;              # Step type waveforms on channels 1 thru 32
                                    # channel 35.
        Analog 33, 34;              # Analog waveform on channels 33 and 34.
    }
    Port 1                          # Declares the GBUS Port for this module.
    {
        SerialNumber 1;             # Required. Should match setting in Module
                                    # Configuration File.
        ProductRevision 1;          # Required. Should match setting in Module
                                    # Configuration File.
        Params                      # To be passed to DLL.
        {
            test    "param1";
            key     "abc";
        }
    }
    Port 8
    {
        LogicalPort 3;              # Optional. Designate Logical Port to use in
                                    # offline configuration file. Default is the
                                    # GBUS port.
        SerialNumber 2;
        ProductRevision 1;
        Params                      # To be passed to DLL.
        {
            test    "param1";
            key     "abc";
        }
    }
}
# Module Emulator
EMUModule "module2"
{
    Waveform
    {
        Step 1–32;
    }
    Port 2
    {
        SerialNumber 1;
        ProductRevision 1;
    }
}
# Module Emulator
EMUModule "dps"
{
    Waveform
    {
        Slew 1–32 @ 2.0 V / nS;     # The slew rate is required for all slewing
```

```
                # waveforms.
        }
    Port 4
    {
        SerialNumber 1;
        ProductRevision 1;
    }
}
```

The user may supply the offline configuration file to designate the DUT models that are to be used in simulation and show how these models are attached to the tester resources. In one embodiment, a sample offline configuration file is shown below. Note that with the exception of the PinConnections block, this file has a similar structure as the simulation configuration file. The Global block describes system-wide settings. The DUTModel block describes the DLL containing the DUT model and specifies the ports to load the DUT model. The PinConnections block indicates how each pin is connected to the tester.

```
# T2000 Version of the syntax
Version 0.0.1;
Global
{
    RegSelect "PatTraceSel";      # Pattern Tracing - Name of OASIS Simulated
                                  # Register Selection File.
}
DUTModel "DUT1Sim"
{
    Waveform
    {
        Step 1-32;
    }
    DUT 1
    {
        Params
        {
            param1Name    "param1Value";
            param2Name    "param2Value";
        }
        PinConnections
        {
            L3.1    1     1.0 nS;
            L3.2    8     1.0 nS;
            L3.3    2     1.0 nS;
            L3.4    7     1.0 nS;
            L3.5    3     1.0 nS;
            L3.6    6     1.0 nS;
            L3.7    4     1.0 nS;
            L3.8    5     1.0 nS;
            L3.9    9     1.0 nS;
            L3.10   16    1.0 nS;
            L3.11   10    1.0 nS;
            L3.12   15    1.0 nS;
            L3.13   11    1.0 nS;
            L3.14   14    1.0 nS;
            L3.15   12    1.0 nS;
            L3.16   13    1.0 nS;
        }
    }
}
DUTModel "DUT2Sim"
{
    Waveform
    {
        Slew 1-16 @ 2.0 V/nS;
    }
    DUT 2
    {
        Params
        {
            param1Name    "param1Value";
            param2Name    "param2Value";
        }
        PinConnections
        {
```

```
                -continued
        L2.1    1;    # no delay specified means a delay of 0
        L2.2    2;
        L2.3    3;
        L2.4    4;
        L2.12   5;
        L2.13   6;
        L2.14   7;
        L2.15   8;
      }
    }
}
```

Framework Configuration

As discussed above, module vendors are required to provide emulations of their hardware modules. Because of this requirement, a user who acquires a vendor module also acquires an emulation module of that component. The emulation module comes in the form of a DLL that has an interface for making the module loadable by the simulation framework. This is specified through a set of predefined interface requirements placed on the vendor's DLL. To load an emulation module to the simulation framework, a simulation configuration file is either provided by the user or generated by the test system. The simulation configuration file enumerates each DLL to be loaded. In addition to naming the DLL, the simulation configuration file specifies parameters that are consistent with the hardware settings of the test system to be simulated. This includes the module port number, the module serial number, the number of channels, the format of the waveform on each channel, and the reference voltage used through out the simulation, etc. The simulation configuration file includes other parameters that are artifacts of the simulation. These include the logical references used to attach the channels from a module to DUT pins, and specific parameters passed to the DLL when the modules are loaded.

In one embodiment, the simulation manager performs the following functions to configure the simulation:

load all components as directed by the simulation configuration file;

divide the components and resources amongst the various sites; and provide a central object for managing pattern execution on all threads.

In addition, the simulation manager uses the configuration files to perform the following functions:

instantiate all component and interface objects;

connect all components as specified by the configuration files; and provide mapping from component channels to interface objects.

Note that to insure that there is only one instance of SimMgr, the only public method that can create a SimMgr is the create( ) method. A matching release( ) method is used to clean up resources after simulation. The create( ) method creates the simulation base on the simulation configuration file specified in the argument list. The path argument is used to specify a base path for other text files referenced inside the simulation configuration file. These files are specified as paths relative to the base path.

Once the simulation framework has been configured, it waits for a test program and a target DUT model to be specified. Prior to loading the test program, the TOS notifies the simulation framework that one or more DUT models have been specified. This is done through another configuration file called the offline configuration file. The DUT model comes either in the form of an end-user supplied DLL written in C/C++ that satisfies a set of predefined interface requirements, or as a Verilog model running on a server that waits for connections from a simulation. The offline configuration file specifies one or more DUT model DLLs to load. In addition, the file specifies parameters that are consistent with the hardware settings of the DUT. This includes the channels and formats of the waveform, the wiring of the logical tester channels to DUT pins, and the transport delays associated with that wiring. The offline configuration file also includes other parameters that are artifacts of the simulation. These include the specific parameters passed to the DLL when loading DUT models. To access Verilog DUT models, the framework provides a special DUT model DLL. This model can be configured to connect to a specific server upon which the program running the specific Verilog model is running.

Framework Initialization

In one embodiment, the initialization of the simulation framework includes the following procedures:

1. load module DLLs and instantiate module emulation objects in memory based on the simulation configuration file;
2. wait for the offline configuration file (which describes the DUT models to be loaded and how they are connected to the modules) to be provided by the user;
3. use both configuration files to build a simulation as follows:
   a. use the site information programmed into the system via the bus emulation to assign modules and DUTs to various sites;
   b. connect the modules to a loadboard model in the simulation framework dedicated to that particular site; and
   c. connect the DUT models in each site to the corresponding site of the loadboard model.
4. When the test plan is unloaded, unload the structure created in Step 3 and wait for another offline configuration file.

The framework breaks up the simulation on a per-site basis to facilitate a multi-threaded simulation. The sites can be simulated in parallel. As a result, breaking up the simulation according to predefined simulation sites make them thread-safe with respect to one another and avoids the need for any locking mechanism that may impact performance.

Figure 6:
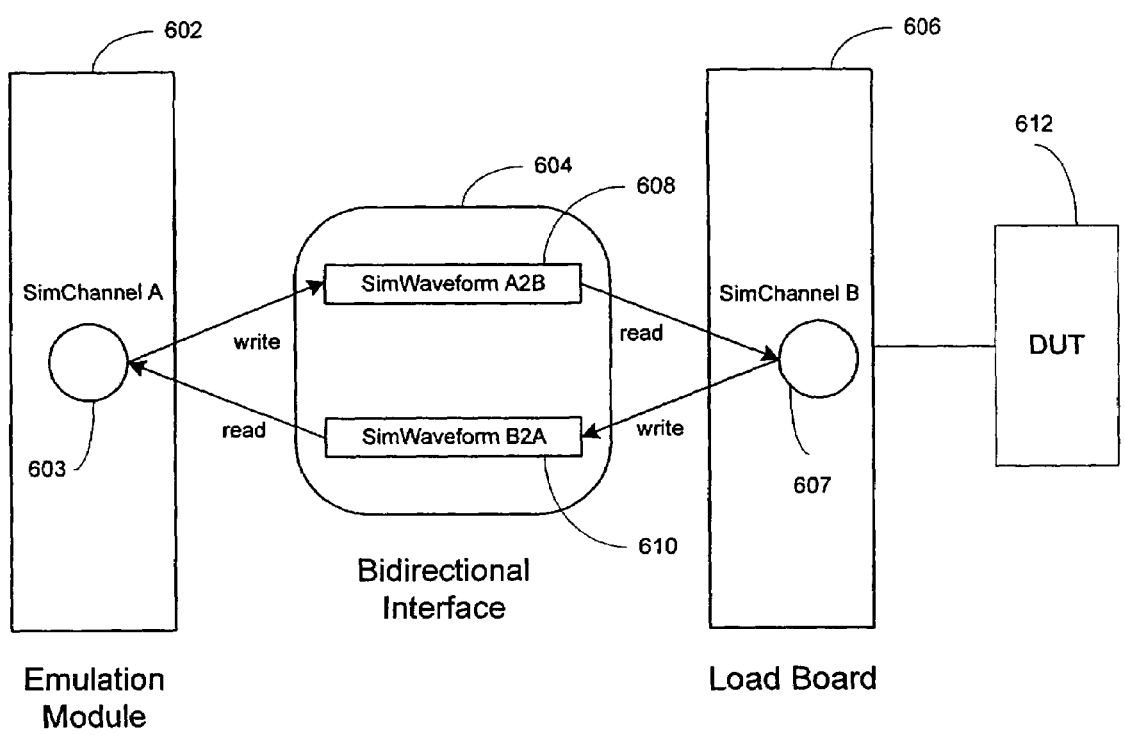
FIG. 6 illustrates a channel between the emulation module and the loadboard model according to an embodiment of the present invention.

Upon loading the configuration data, the simulation framework begins to build a simulation by constructing a connection for each channel in a module to an object in the simulation framework via the loadboard. FIG. 6 illustrates a channel between the emulation module and the loadboard model according to an embodiment of the present invention.

The channel includes an emulation module 602, a bidirectional interface model 604, and a loadboard model 606. The emulation module 602 contains an I/O port SimChannelA 603, and similarly the loadboard model contains an I/O port SimChannel B 607. There are two buffers within the bidirectional interface 604, a SimWaveform A2B buffer 608 for transferring data from the emulation module 602 to the loadboard model 606, and a SimWaveform B2A buffer 610 for transferring data from the loadboard model 606 to the emulation module 602. As shown in FIG. 6, the emulation module 602 writes to the SimWaveform A2B buffer 608 and reads from the SimWaveform B2A buffer 610. On the other hand, the loadboard model 606 writes to the SimWaveform B2A buffer 610 and reads from the SimWaveform A2B buffer 608.

Each of the SimWaveform A2B and SimWaveform B2A buffers contain a table for storing information about the channel. Specifically, the buffers store voltages read from a channel object at arbitrary points in time. Voltage values of the channel read between times of table entries are interpolated using one of several standard models described in FIG. 3b above. The selection of the model to use with a specific channel is user configurable. Switching models is done by making SimWaveform a base class for other waveform classes. SimWaveform has a virtual function read( ) that returns a voltage of a given time. Each derived class implements read( ) according to the waveform being modeled (e.g., the SimWaveformStep models a square wave). An analogous technique is used to model window strobes.

As shown in FIG. 6, DUT models 612 are coupled to the loadboard. This connection is made by using an instance of the SimWire class of the simulation framework. The SimWire class has access to the buffers in the bidirectional interface objects. The SimWire class resolves drive conflicts between the DUT and the modules. Note that the connection between the loadboard 606 and DUT model 612 in FIG. 6 is a mirror image of the connection between the emulation module 602 and the loadboard 606. The details of this connection are left out of the diagram so that the details of the connection between the module and the loadboard can be shown more clearly.

After the simulation is constructed, the test program is loaded. This involves making calls into the system bus device driver. In the offline mode, the device driver access to the hardware is diverted to a shared memory I/O, allowing a site controller process to communicate with the simulation framework process. There is a high degree of correlation between the behaviors of online and offline test simulation, since the only different component of the two simulation setups is in the device driver.

Framework Execution

There are two types of simulations running during test plan execution. The first is an event-based simulation. The components being simulated are usually the emulation modules. These components are event-based in nature because their behavior is specified by the test program before the simulation has started. The other type of simulation is a time-based simulation. The components being simulated are usually the DUT models. These components are time-based in nature because their states are propagated forward based upon external stimuli and the current internal state. The simulation framework coordinates the execution and data transfer between the event-based and time-based simulations.

The event-based simulation uses a registration and handling process. Simulation components, which are typically emulation modules, need to be registered for each simulation event. After registration, when the conditions of a test event arise, the component's event handler callback is invoked, allowing the appropriate simulation procedures to be executed.

The time-based simulation relies on the output of the event-based components. The simulation framework computes a time window that captures the stimuli generated by the event-based components for all channels that feed the time-based components. The time-based components are then called with the computed time window. The data sent from the event-based components to the time-based components needs to be stable. This stability criterion is enforced by having the event-based components satisfy a set of predetermined timing requirements when writing to their output channels.

The simulation framework provides automatic resolution of drive conflicts between the emulation modules and the DUT models. A drive conflict is typically caused by timing errors in the test program. Identifying these errors before they occur on actual hardware is crucial since doing so can avoid damage to both the DUTs and the test equipment. The SimWire object in the loadboard model resolves drive conflicts. After components on both sides of the SimWire have received their inputs, the simulation framework calls the SimWire object to resolve the signals from both sides. If only one channel has drive input, then it is copied to the other channels, with the appropriate transport delay applied. If multiple sides to the SimWire object have received drive inputs, then the voltages in the output buffers are set to reflect this conflict. Once the output buffers are set, the modules that have registered to read from them are called. The resolved voltage data is then accessed. Since voltage resolution is encapsulated in the SimWire object, the process is transparent to the rest of the simulation.

There are a number of benefits achieved by the disclosed method for simulating a modular test system. First, by providing an accurate and detailed simulation of the test programs, the disclosed method enables engineers to develop the test programs on their own workstation as opposed to on the expensive tester equipment. Second, the disclosed method identifies problems in the test programs, emulation modules, and DUT models before they are run on the test equipment thereby allowing such problems to be resolved earlier. Third, the disclosed method supports a parallel development model that enables a shorter test program development cycle and faster time to market of the DUTs.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and its practical applications, and to enable others skilled in the art to best utilize the invention and various embodiments with various modifications as are suited to the particular use contemplated.

What is claimed is:

1. A method for simulating a modular test system, comprising:

provoding a controller, wherein the controller controls at least one vendor module and its corresponding device under test (DUT) model;

creating a simulation framework for establishing standard interfaces between the at least one vendor module and its corresponding DUT model;

configuring the simulation framework; and simulating the modular test system using the simulation framework, wherein simulating the modular test system comprises:

performing event-based simulations of the vendor modules;

performing time-based simulations of the DUT models; and transferring simulation data between the event-based simulations and the time-based simulations, wherein transferring simulation data comprises resolving drive conflict between vendor modules and the DUT models automatically during simulation.

2. The method of claim 1, wherein creating a simulation framework comprises:

creating a vendor module interface for handling communication between the vendor modules and the modular test system; and creating a DUT model interface for handling communication between DUT models and the vendor modules.

3. The method of claim 2, wherein creating the vendor module interface comprises:

implementing the vendor modules in accordance with a first set of predetermined standard interfaces; and implementing virtual functions for modeling behaviors of the vendor modules.

4. The method of claim 2, wherein creating the DUT model interface comprises:

implementing the DUT models in accordance with a second set of predetermined standard interfaces; and implementing virtual functions for modeling behaviors of the DUT models.

5. The method or claim 2, wherein creating a simulation framework further comprises:

providing a common interface for setting dynamic voltage levels at output channels of the vendor modules and the DUT models.

6. The method of claim 1, wherein configuring the simulation framework comprises:

generating a simulation configuration file (SCF); and loading the simulation configuration file to the modular test system.

7. The method of claim 6, wherein the simulation configuration file comprises:

one or more vendor module DLLs;

hardware settings of the modular test system; and simulation parameters.

8. The method of claim 6, wherein configuring the simulation framework comprises:

generating an offline configuration file; and loading the offline configuration file to the modular test system.

9. The method of claim 8, wherein the offline configuration file comprises:

one or more DUT model DLLs;

hardware settings of the DUTs; and offline simulation parameters.

10. The method of claim 8, wherein configuring the simulation framework further comprises:

loading vendor module DLLs;

receiving the offline configuration file; and building a simulation structure in accordance with the simulation configuration file and the offline configuration file.

11. The method of claim 1, wherein simulating the modular test system comprises testing a plurality of DUT models in parallel.

12. The method of claim 1, wherein simulating the modular test system comprises adding one or more vendor modules to the modular test system without modifying the simulation framework.

13. The method of claim 1, wherein simulating the modular test system comprises removing one or more vendor modules from the modular test system without modifying the simulation framework.

14. The method of claim 1, wherein simulating the modular test system comprises adding one or more DUT models to the modular test system without modifying the simulation framework.

15. The method of claim 1, wherein simulating the modular test system comprises removing one or more DUT models from the modular test system without modifying the simulation framework.

16. The method of claim 1, wherein simulating the modular test system comprises adding one or more DUT models to the modular test system without stopping a running simulation.

17. The method of claim 1, wherein simulating the modular test system comprises removing one or more DUT models from the modular test system without stopping a running simulation.

18. A modular test system, comprising:

one or more vendor modules;

one or more device under test (DUT) models;

a controller for controlling the vendor modules and their corresponding DUT models;

a simulation framework for establishing standard interfaces between the vendor modules and the DUT models;

means for configuring the simulation framework; and means for simulating the modular test system using the simulation framework, wherein the means for simulating the modular test system comprise:

means for performing event-based simulations of the vendor modules;

means for performing time-based simulations of the DUT models; and means for transferring simulation data between the event-based simulations and the time-based simulations, wherein the means for transferring simulation data comprise the means for resolving drive conflict between vendor modules and the DUT models automatically during simulation.

19. The system of claim 18, wherein the simulation framework comprises:

a vendor module interface for handling communication between vendor modules and the modular test system; end a DUT model interface for handling communication between DUT models and the vendor modules.

20. The system of claim 19, wherein the vendor module interface comprises:

vendor modules implemented in accordance with a first set of predetermined standard interfaces; and virtual functions for modeling behaviors of the vendor modules.

21. The system of claim 19, wherein the DUT model interface comprises:
DUT models implemented in accordance with a second set of predetermined standard interfaces; and
virtual functions for modeling behaviors of the DUT models.

22. The system of claim 19, wherein the simulation framework further comprises:
a common interface for setting dynamic voltage levels at output channels of the vendor modules and the DUT models.

23. The system of claim 18, wherein the means for configuring the simulation framework comprise:
means for generating a simulation configuration file (SCF); and
means for loading the simulation configuration file to the modular test system.

24. The system of claim 23, wherein the simulation configuration file comprises:
one or more vendor module DLLs;
hardware settings of the modular test system; and
simulation parameters.

25. The system of claim 23, wherein the means for configuring the simulation framework comprise:
means for generating an offline configuration file; and
means for loading the offline configuration file to the modular test system.

26. The system of claim 25, wherein the offline configuration file comprises:
one or more DUT model DLLs;
hardware settings of the DUTs; and
offline simulation parameters.

27. The system of claim 25, wherein the means for configuring the simulation framework further comprise:
means for loading vendor module DLLs;
means for receiving the offline configuration file; and
means for building a simulation structure in accordance with the simulation configuration file and the offline configuration file.

28. The system of claim 18, wherein the means for simulating the modular test system comprise the means for testing a plurality of DUT models in parallel.

29. The system of claim 18, wherein the means for simulating the modular test system comprise the means for adding one or more vendor modules to the modular test system without modifying the simulation framework.

30. The system of claim 18, wherein the means for simulating the modular test system comprise the means for removing one or more vendor modules from the modular test system without modifying the simulation framework.

31. The system of claim 18, wherein the means for simulating the modular test system comprise the means for adding one or more DUT models to the modular test system without modifying the simulation framework.

32. The system of claim 18, wherein the means for simulating the modular test system comprise means for removing one or more DUT models from the modular test system without modifying the simulation framework.

33. The system of claim 18, wherein the means for simulating the modular test system comprise means for adding one or more DUT models to the modular test system without stopping a running simulation.

34. The system of claim 18, wherein the means for simulating the modular test system comprise means for removing one or more DUT models from the modular test system without stopping a running simulation.

* * * * *